(12) United States Patent
Landry

(10) Patent No.: US 6,611,935 B1
(45) Date of Patent: Aug. 26, 2003

(54) METHOD AND SYSTEM FOR EFFICIENTLY TESTING CIRCUITRY

(75) Inventor: Greg J. Landry, Merrimack, NH (US)

(73) Assignee: Cypress Semiconductor Corporation, San Jose, CA (US)

(*) Notice: Subject to any disclaimer, the term of this patent is extended or adjusted under 35 U.S.C. 154(b) by 317 days.

(21) Appl. No.: 09/652,806

(22) Filed: Aug. 31, 2000

(51) Int. Cl.[7] ............................................. G01R 31/28
(52) U.S. Cl. ..................................................... 714/736
(58) Field of Search ................................ 714/725, 736; 326/40

(56) References Cited

U.S. PATENT DOCUMENTS 6,003,150 A * 12/1999 Stroud et al. ............... 714/725
6,405,334 B1 * 6/2002 Tien .......................... 714/725

OTHER PUBLICATIONS

Huang et al., An Approach for Detecting multiple Faulty FPGA Logic Blocks, Jan. 2000, IEEE, vol. 49, No. 1, p. 48–54.*

Huang et al., Testing Memory Modules in SRAM–Based Configurable FPGAs, 1997, IEEE, p. 79–86.*

Huang et al., An Approach for Testing Programmable/Configurable Field Programmable Gate Arrays, 1996, IEEE, p. 450–455.*

* cited by examiner

Primary Examiner—Albert DeCady
Assistant Examiner—Shelly A Chase
(74) Attorney, Agent, or Firm—Wagner, Murabito & Hao LLP (57) ABSTRACT

A method and system for efficiently testing circuitry. The method and system may be applied to testing embedded memory circuit blocks within a programmable logic device (PLD). Circuitry used in the testing process can be implemented from the programmable logic resources of the PLD, or alternatively, could be provided as specialized, dedicated test mode circuitry. The PLD may contain an arbitrary number, n, of memory blocks with each block having an arbitrary number, x, of output pins. An AND-tree circuit is implemented that receives each of the n*x output pins. If any pin is low, the output of the AND-tree is low, otherwise, the output is high. The output of the AND-tree is an input/output pin of the PLD. An OR-tree circuit is implemented that receives each of the n*x output pins. If any pin is high, the output of the OR-tree is high, otherwise, the output is low. The output of the OR-tree is another input/output pin of the PLD. The OR-tree and AND-tree circuits can be used to detect any manufacturing faults within the PLD and can also be used to measure the max/min delay timing of the memory block signals. During testing, predetermined patterns of logic are loaded into the memory blocks and read back in predetermined sequences using the AND-tree and OR-tree results. Using this method and system, a tester can be used that has reduced pin count and parallel testing can be performed.

23 Claims, 11 Drawing Sheets

METHOD AND SYSTEM FOR EFFICIENTLY TESTING CIRCUITRY

BACKGROUND OF THE INVENTION

1. Field of the Invention

The present invention relates to the field of testing electronic devices. More specifically, the present invention relates to an improvement for efficiently testing programmable logic devices for manufacturing errors.

2. Related Art

Programmable logic devices (PLDs) provide programmable resources that can be configured to implement custom designs within an integrated circuit device or integrated circuit "chip." The PLD can be a programmable logic device, such as a complex programmable logic device (CPLD), or a field programmable logic array (FPGA). These programmable logic devices contain generic functional modules that can be electrically coupled together and programmed to perform certain functions and generate specific signals such that a custom integrated circuit or PLD design can be realized in hardware. The programmable devices may also contain embedded memory blocks. Each memory block typically contains a number of outputs typically called data outputs. The integrated circuit device also contains a number of externally available input/output pins (I/O pins). The programmable resources within the PLD allow a memory, e.g., data, output to be selectively connected to an externally available I/O pin.

Integrated circuit devices that contain embedded memory blocks, such as PLDs, need to be tested after they are fabricated. The testing is done to detect any possible manufacturing faults or defects within the integrated circuit that would cause the device to operate in an unpredictable manner or in any manner that is not in accordance with the IC design. Typically, tester systems are attached to the device under test (DUT) and they stimulate the device with certain test patterns which are called logic vectors. The actual outputs of the DUT are then captured by the tester system and compared against a predetermined expected result (typically produced by device simulation). If the expected results and the actual outputs are different, then a fault or defect may be detected (and the device is rejected).

There are two possible methods for testing the embedded memory blocks of a programmable device. The first method allows the memory blocks to be tested in parallel by programming all outputs from every memory block to connect with the outputs of the chip, e.g., the externally available I/O pins. In the exemplary case of a 39K100 device, there are 24 embedded memory blocks, each with 8 outputs. Therefore, using this method of testing, a total of 192 I/O pins (external outputs) are required. One disadvantage of this testing method is that it requires a large number of I/O pins. This places a limitation on how many memory blocks can be tested in parallel due to the number of I/O pins available in a device package and it also places limitations on the test equipment and hardware. Not all testers have the capacity to test devices with this many I/O pins. Further, not all PLDs have this many I/O pins. What is needed is a testing method that does not require so many I/O pins.

The second method of testing embedded memory blocks of a programmable device allows a reduced set of I/O pins by testing each of the memory blocks one at a time and connecting only the memory block under test to the I/O pins of the chip. In the case of the 39K100 device, only 8 I/O pins are required but 24 separate tests are needed (one for each embedded memory block), and each test is done in series. A disadvantage of the second testing method is that it requires the memory blocks to be tested separately instead of in parallel. Therefore, the net test time increases dramatically. What is needed is a time efficient testing method that does not require so many I/O pins.

SUMMARY OF THE INVENTION

Accordingly, what is needed is a system and method for testing integrated circuits that is time efficient and that is efficient in the utilization of I/O pins. What is needed is a system and method for testing embedded memory blocks of a programmable device, e.g., a PLD, that is time efficient and that is efficient in the utilization of I/O pins. These and other advantages of the present invention not specifically recited above will become clear within discussions of the present invention presented herein.

A method and system are described for efficiently testing circuitry. A purpose of the present invention is to use logic available in a programmable logic device (PLD) to simplify testing of embedded memory blocks. This allows both the functionality and speed of all memory blocks to be tested simultaneously with a reduced set of output pins, e.g., two, rather than requiring direct testing of all outputs from every memory block.

The method and system may be applied to testing embedded memory circuit blocks within a PLD. Circuitry used in the testing process can be implemented from the programmable logic resources of the PLD, or alternatively, could be provided as specialized, dedicated test mode circuitry. The PLD may contain an arbitrary number, n, of memory blocks with each block having an arbitrary number, x, of output pins. An AND-tree circuit is implemented that receives each of the n*x output pins. If any pin is low, the output of the AND-tree is low, otherwise, the output is high. The output of the AND-tree is an input/output pin of the PLD. An OR-tree circuit is implemented that receives each of the n*x output pins. If any pin is high, the output of the OR-tree is high, otherwise, the output is low. The output of the OR-tree is another input/output pin of the PLD. The OR-tree and AND-tree circuits can be used to detect any manufacturing faults within the PLD and can also be used to measure the max/min delay timing of the memory block signals. During testing, predetermined patterns of logic are loaded into the memory blocks and read back in predetermined sequences using the AND-tree and OR-tree results. Using this method and system, a tester can be used that has reduced pin count and parallel testing can be performed.

More specifically, an embodiment of the present invention includes a programmable logic device comprising: a plurality of electronic circuits comprising a set of outputs and capable of receiving a test vector for parallel testing operations; an AND-tree circuit coupled to the set of outputs and for generating a first resulting output signal in response to the set of outputs; an OR-tree circuit coupled to the set of outputs and for generating a second resulting output signal in response to the set of outputs; and wherein the first and second output signals are for use by a tester system in detecting a defect within the plurality of electronic circuits by comparing the first and second resulting output signals to pre-defined first and second expected output signals. Embodiments also include the above and wherein the plurality of electronic circuits are a plurality of embedded memory blocks within the programmable logic device.

Embodiments include the above and wherein the AND-tree is implemented using configurable logic resources of the programmable logic device and wherein the OR-tree is implemented using configurable logic resources of the programmable logic device.

Embodiments include the above and wherein the first and second resulting output signals are for use by the tester system in determining a maximum signal delay time of the plurality of electronic circuits and wherein the first and second resulting output signals are for use by the tester system in determining a minimum signal delay time of the plurality of electronic circuits. Embodiments also include methods implemented in accordance with the above.

DETAILED DESCRIPTION OF THE INVENTION

In the following detailed description of the present invention, a time efficient and I/O pin efficient method of testing a programmable device that also obtains maximum and minimum signal delays, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

NOTATION AND NOMENCLATURE

Some portions of the detailed descriptions which follow are presented in terms of procedures, steps, logic blocks, processing, and other symbolic representations of operations on data bits that can be performed on computer memory. Some of these processes can be performed on the tester system described herein. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "translating" or "calculating" or "determining" or "scrolling" or "displaying" or "recognizing" or "synthesizing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Figure 1:
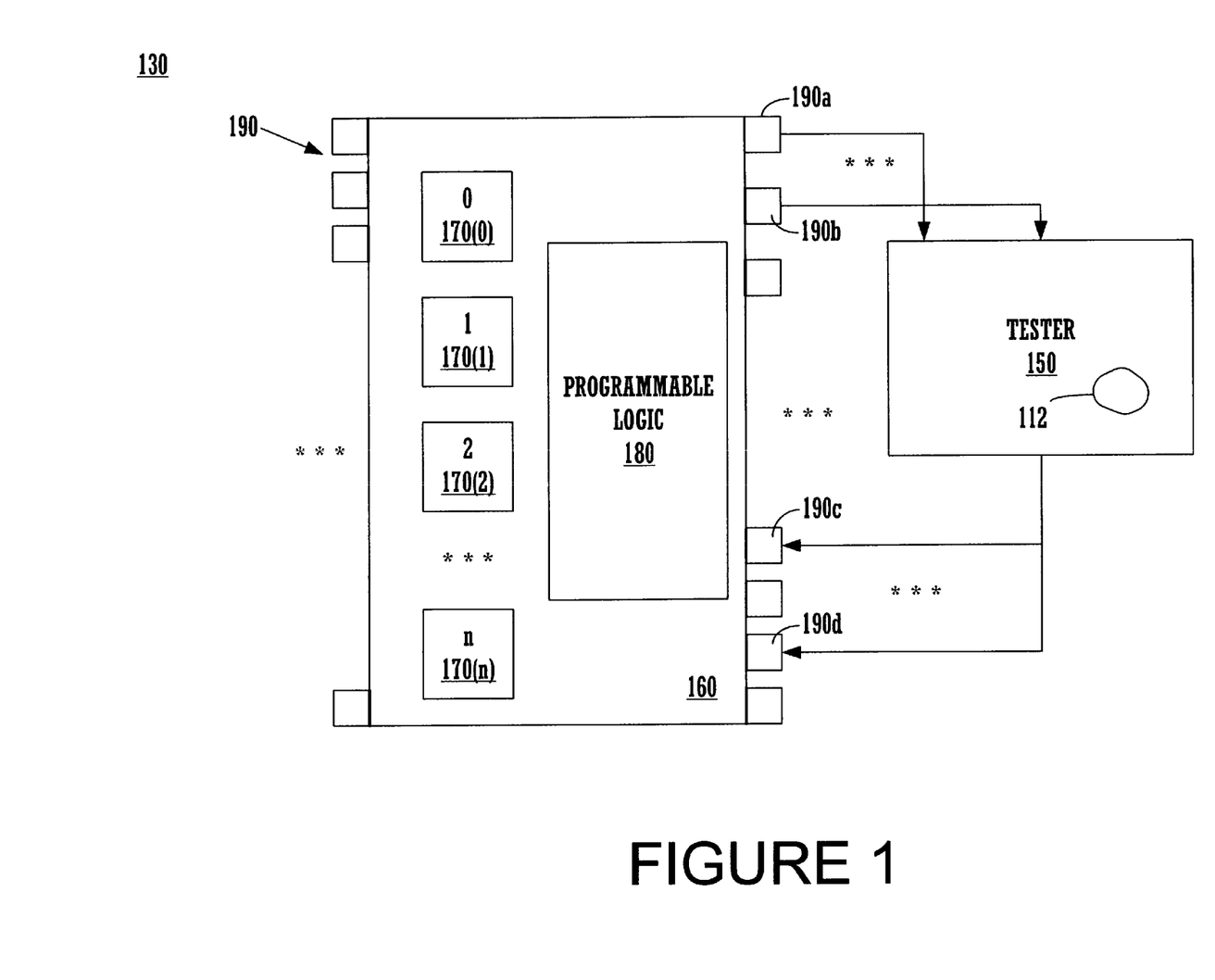
FIG. 1 is a block diagram of a device under test (DUT) connected to a tester system.

FIG. 1 illustrates a system 130 in accordance with an embodiment of the present invention. System 130 may contain an electronic circuit 160 that can be, in one embodiment, a programmable logic device (PLD). The electronic circuit 160 contains a number of other embedded electronic circuits 170(0)–170(n) that require testing. In accordance with the present invention, the electronic circuits 170(0)–170(n) can be any circuit that requires efficient testing. In one embodiment, the embedded electronic circuits 170(0)–170(n) are programmable memory circuits also called memory blocks. The present invention is applicable to alternative logic such as other programmable logic devices, e.g., FPGAs and PLAs. There are n memory blocks. Each memory block has x number of outputs. Therefore, n*x number of outputs are associated with the embedded memory blocks 170(0)–170(n). Also within the logic device 160 may be embedded configurable or programmable logic 180. This logic 180 can be programmed to implement custom electronic circuit designs. In one embodiment of the present invention, the embedded programmable logic 180 can be used to provide functionality in testing the embedded memory blocks 170(0)–170(n).

System 130 may also contain an electronic tester system 150. Tester system 150 is an electronic system, that may contain one or more general purpose computer systems 112. Tester system 150 is capable of applying a set of digital test patterns, also called logic vectors or test patterns, to the logic device 160. The tester system 150 is also capable of capturing the outputs from the logic device 160 that are generated in response to the applied test patterns. The tester system 150 can then compare the outputs from the logic device against expected outputs that are predetermined. In this way, the tester system 150 can detect any manufacturing defects or faults within the circuitry of the logic device 160.

In order to carry out this testing process, the tester system 150 is operable to be coupled to externally available input/output (I/O) pins 190 of the logic device 160. In the example shown in FIG. 1, the tester system 150 may be coupled to I/O pins 190c–190d (or more pins as required) in order to address memory blocks 170(0)–170(n) and apply the test vectors to them. In this capacity, address and data I/O pins may be used. The tester system 150 is also coupled to I/O pins 190a and 190b to capture the output of the logic device 160 that is generated in response to the applied test vector. The present invention advantageously requires a reduced set of I/O pins to perform the output capturing function while still allowing efficient parallel testing of the memory blocks 170(0)–170(n). In one embodiment of the present invention, only two I/O pins 190a and 190b are required to perform the output capturing function. It is appreciated that using the techniques of the present invention, maximum and minimum signal delay of the memory blocks 170 can be determined.

Figure 2A:
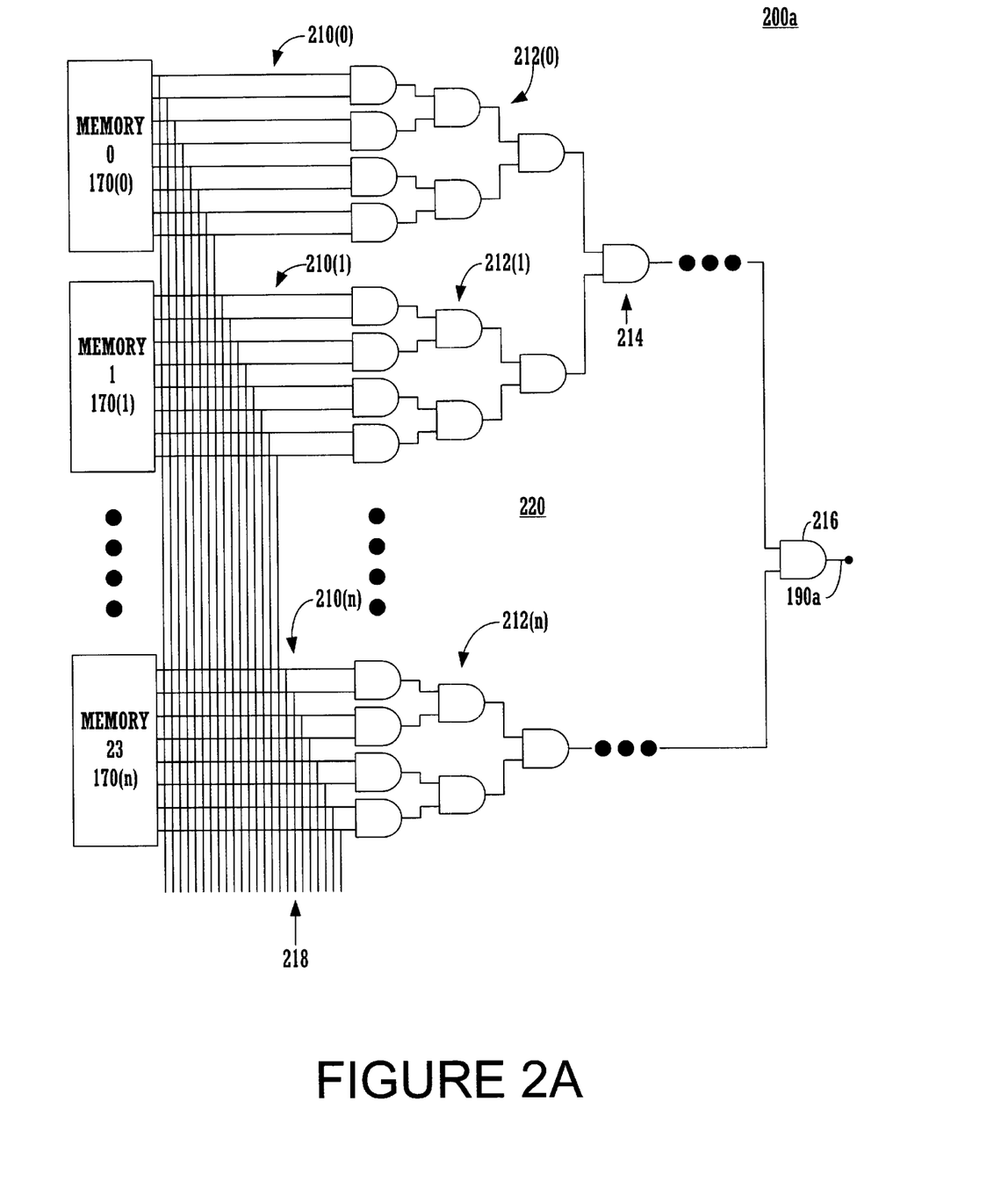
FIG. 2A illustrates an AND-Tree circuit in accordance with one embodiment of the present invention connected between data outputs of embedded memory blocks and an I/O pin of a programmable integrated circuit device.
Figure 2B:
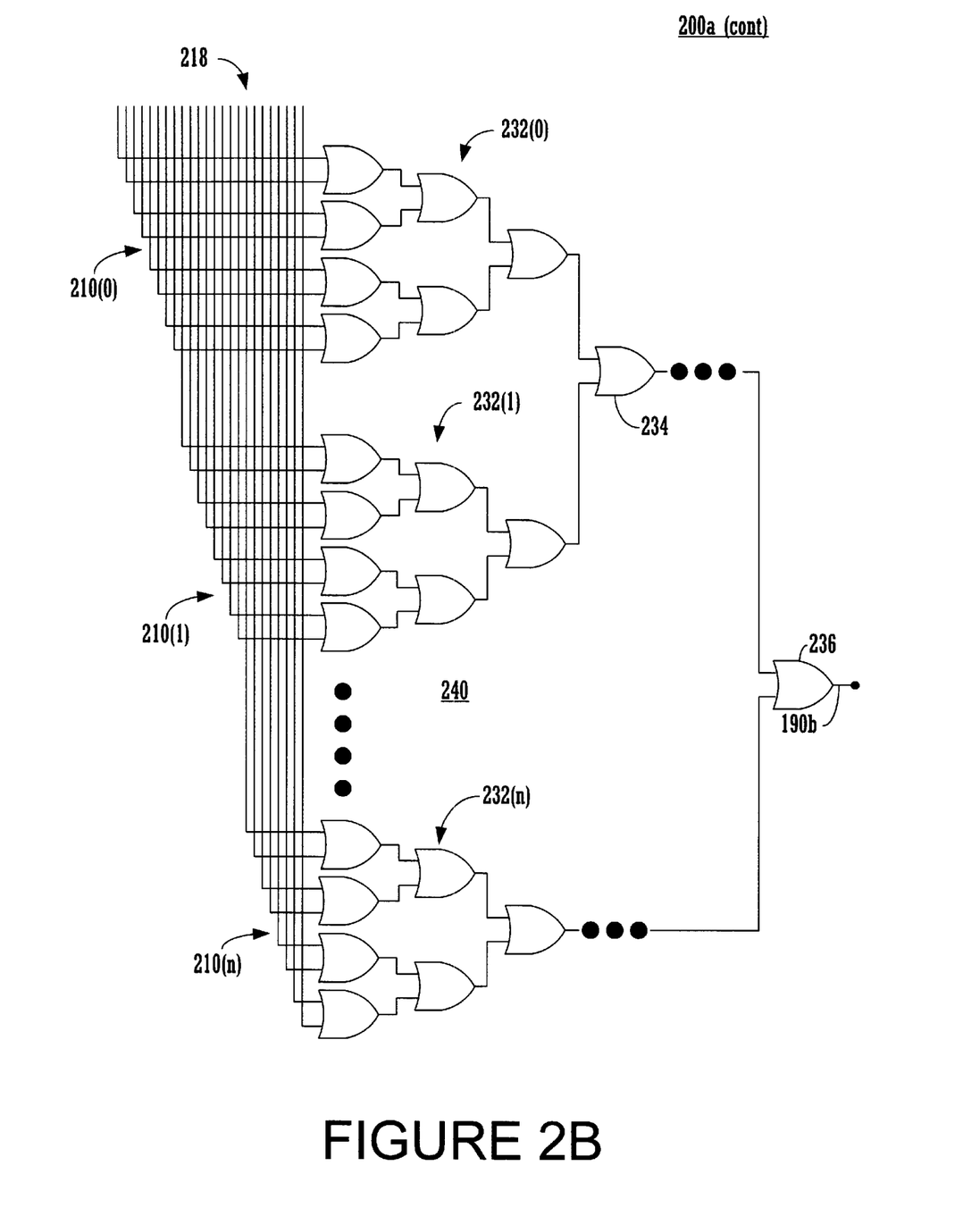
FIG. 2B illustrates an OR-Tree circuit in accordance with one embodiment of the present invention connected between data outputs of embedded memory blocks and an I/O pin of a programmable integrated circuit device

FIG. 2A and FIG. 2B illustrate a circuit 200a in accordance with one embodiment of the present invention embedded within the logic device 160. In circuit 200a, an AND-tree circuit 220 and an OR-tree circuit 240 are included and receive the n*x outputs of the memory blocks 170. Two output signals 190a and 190b are generated. It is appreciated that the AND-tree 220 and/or the OR-tree 240 circuitry may be implemented using the programmable logic resources 180 (FIG. 1) of the logic device 160, or, alternatively, this circuitry may be dedicated circuitry embedded on the logic device 160. If implemented using the programmable logic resources 180, then the logic device 160 needs first to be programmed before testing can commence. This programming can be accomplished by the tester system 150.

FIG. 2A illustrates an AND-tree circuit 220 that can be coupled to the n*x outputs of the memory blocks 170 and that can generate a single output 190a. In this exemplary configuration there are n=24 memory blocks, (numbered 0 to 23) and each block has x=8 outputs. Memory block 170(0) has eight outputs 210(0) which are fed to four first stage AND gates. The outputs of these first stage AND gates are fed to two second stage AND gates which generate two outputs which are fed to one third stage AND gate. The first, second and third stage AND gates are within circuit 212(0). Circuit 212(0) is replicated 23 other times, as circuits 212(1)–212(n), for outputs 210(1)–210(n), respectively, for memory blocks 170(1)–170(n). Adjacent pairs of circuits, e.g., 212(0) and 212(1), feed a respective fourth stage AND gate, e.g., AND gate 214. In this example, there are n/2 number of fourth stage AND gates. Each fourth stage AND gate feeds a single AND gate 216 which generates a signal for I/O pin 190a and can accept n/2 inputs.

In operation, if any of the n*x outputs from the memory blocks 170 are low (logic "0"), then the signal at I/O pin 190a will go low. Only when every output of the n*x outputs are high (logic "1") will the signal at I/O pin 190a go high. Using the AND-tree logic 220, all of the memory blocks 170 can be tested in parallel, yet only one I/O pin 190a is required.

FIG. 2B illustrates a complementary OR-tree circuit 240 that can be coupled to the n*x outputs of the memory blocks 170 and that can generate a single output 190b. The n*x outputs from the memory blocks 170 are shown at bus 218 which is located in both FIG. 2A and FIG. 2B. Memory block 170(0) has eight outputs 210(0) which are fed to four first stage OR gates. The outputs of these first stage OR gates are fed to two second stage OR gates which generate two outputs which are fed to one third stage OR gate. The first, second and third stage OR gates are within circuit 232(0). Circuit 232(0) is replicated 23 other times, as circuits 232(1)–232(n), for outputs 210(1)–210(n), respectively, for memory blocks 170(1)–170(n). Adjacent pairs of circuits, e.g., 232(0) and 232(1), feed a respective fourth stage OR gate, e.g., OR gate 234. In this example, there are n/2 number of fourth stage OR gates. Each fourth stage OR gate feeds a single OR gate 236 which generates a signal for I/O pin 190b and can accept n/2 inputs.

In operation, if any of the n*x outputs from the memory blocks 170 are high (logic "1"), then the signal at I/O pin 190b will go high. Only when every output of the n*x outputs are low (logic "0") will the signal at I/O pin 190a go low. Using the OR-tree logic 240, all of the memory blocks 170 can be tested in parallel, yet only one I/O pin 190b is required.

When the AND-tree 220 and the OR-tree 240 are implemented, the functionality and speed (minimum and maximum) of the memory blocks 170 can be determined using the two outputs 190a and 190b of the logic device 160. The AND-tree 220 output is low unless all outputs from all memory blocks are high. This allows a single output from the logic device 160, e.g., 190a, to find the slowest memory output to switch to logic 1 and the fastest memory output to switch to logic 0. Therefore, the AND-tree 220 can give information as to the maximum and minimum signal delay through the memory block 170. Likewise, the OR-tree 240 is high unless all outputs from all memory blocks 170 are low. This allows a single output from the logic device 160, e.g., 190b, to find the slowest memory output to switch to logic 0, and the fastest memory output to switch to logic 1. Therefore, the OR-tree 220 can also give information as to the maximum and minimum signal delay through the memory block 170.

As important, the two outputs 190a and 190b of the AND-tree 220 and the OR-tree 240 also indicate a functionality problem if both outputs are not equal to the expected, predetermined, output. The predetermined output is based on a fault free simulation of the behavior of the memory blocks 170. For example, if the expected outputs from the memory blocks are logic 0, but one of the n*x outputs is logic 1, then the output of the OR-tree 240 would be logic 1 instead of logic 0. The tester system 150 would then detect this situation and flag a defect. Alternatively, if the expected outputs from the memory blocks 170 are logic 1, but one of the n*x outputs is logic 0, then the output of the AND-tree 220 would be logic 0 instead of logic 1. The tester system 150 would then detect this situation and flag a defect. Table 1 below illustrates the functionality and signal delay detections available from circuit 200a.

TABLE I

| Circuit | Functionality | Signal Delay |
| --- | --- | --- |
| AND-tree | Output goes low as soon as 1 input goes low, but goes high only when the last input goes high | (fastest 1 −> 0, slowest 0 −> 1) |
| OR-Tree | Output goes high as soon as 1 input goes high, but goes low only when the last input goes low | (fastest 0 −> 1, slowest 1 −> 0) |

The advantages of the present invention over the conventional methods are at least two fold. First, the present invention allows multiple embedded memory blocks to be tested simultaneously. The parallel testing includes both functional and maximum/minimum delay measurement capability. Second, the present invention reduces the physical number of outputs required from the logic device 160 in order to test the embedded memory blocks 170. This eases the requirements placed on the logic device 160 and also the tester system 150.

Figure 3A:
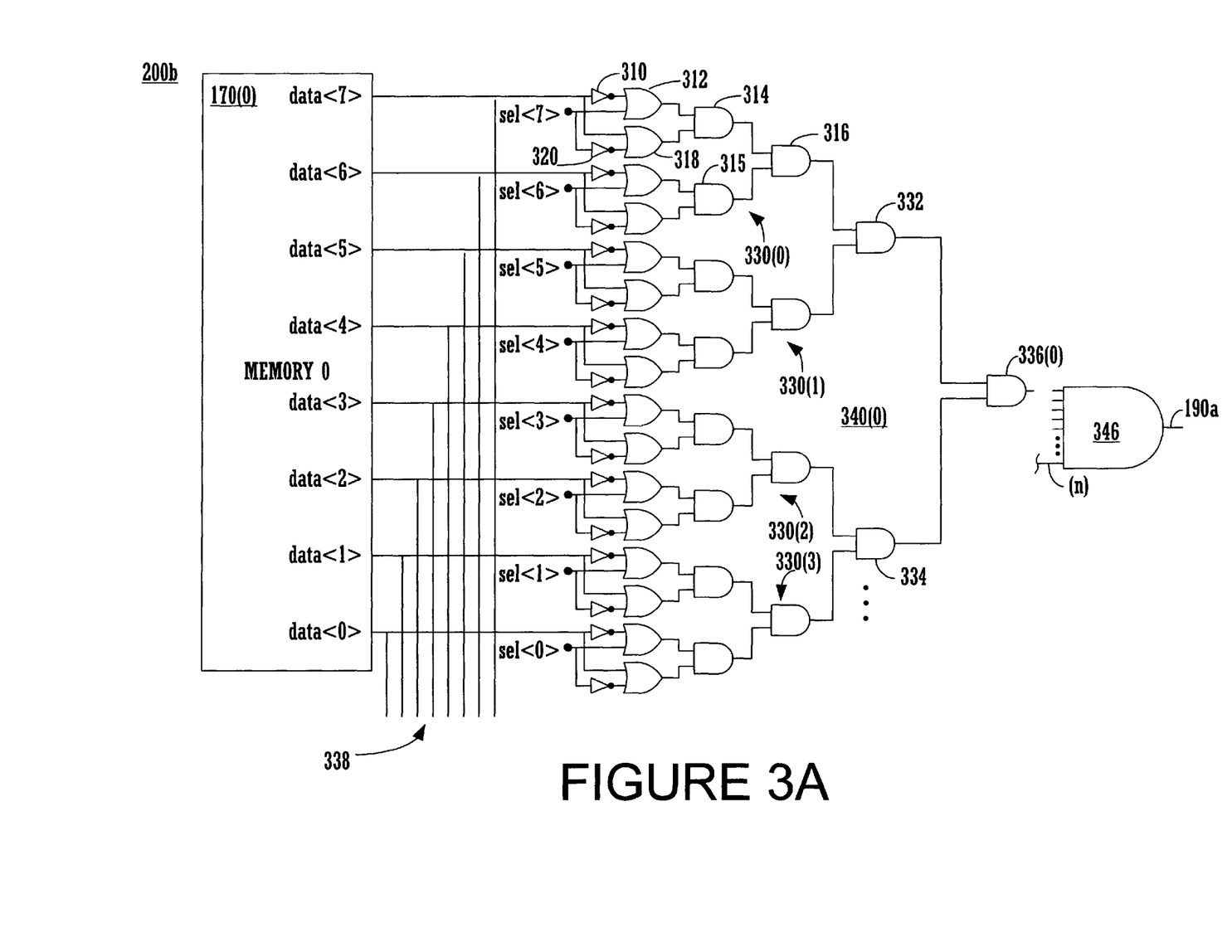
FIG. 3A illustrates an AND-Tree circuit in accordance with another embodiment of the present invention connected between data outputs of embedded memory blocks and an I/O pin of a programmable integrated circuit device.
Figure 3B:
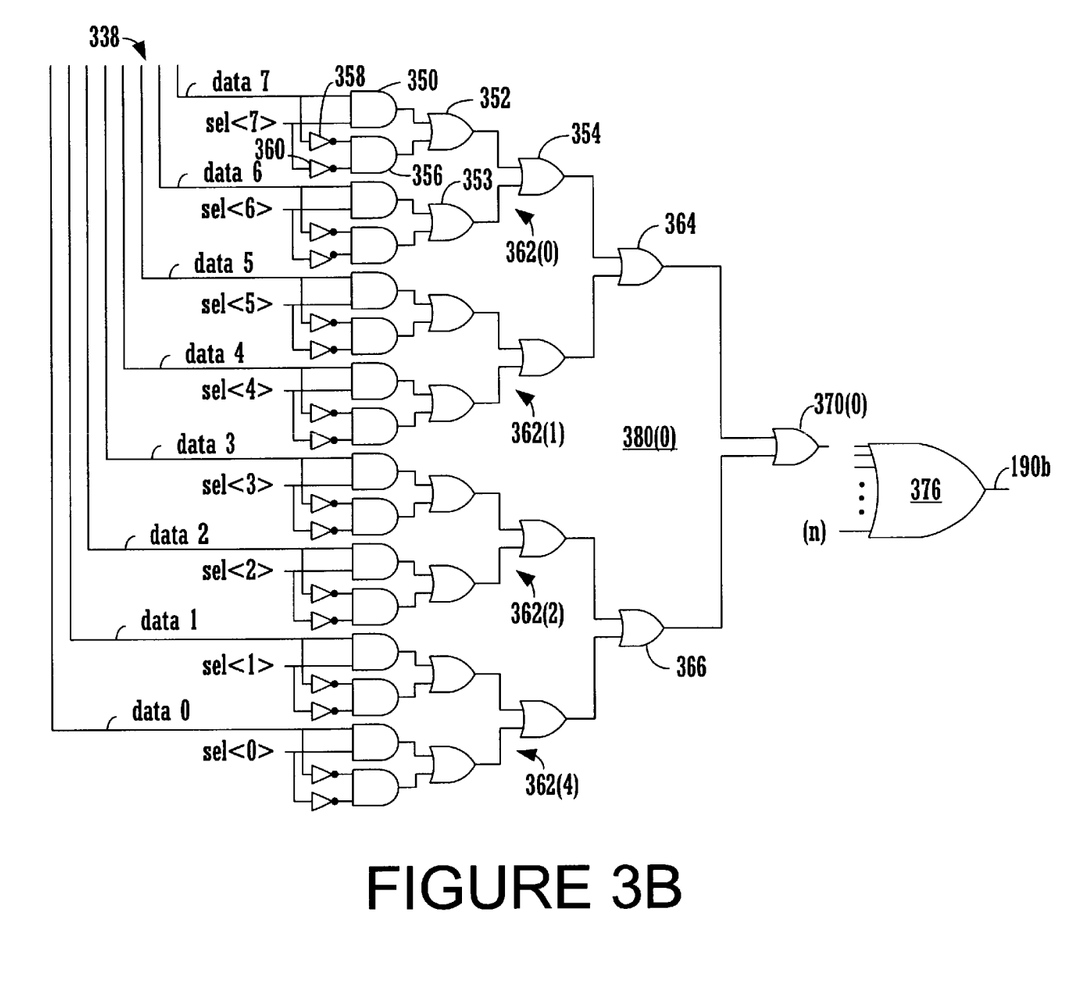
FIG. 3B illustrates an OR-Tree circuit in accordance with another embodiment of the present invention connected between data outputs of embedded memory blocks and an I/O pin of a programmable integrated circuit device.

FIG. 3A and FIG. 3B illustrate an alternative embodiment 200b of the present invention. Instead of combining every output directly into a tree of AND gates and OR gates, this embodiment 200b uses additional gates before the logic tree to allow the selection of either each memory output or its inverse. In this manner, two total outputs could be used from the logic device with any data pattern desired.

For example, if the desired data pattern is an interleaved pattern with alternating logic high and logic low values, then the normal memory outputs would be used for even outputs (e.g., 0, 2, 4, 6 . . . ), while the inverse of the memory outputs would be used for odd outputs (e.g., 1, 3, 5, 7, . . . ). For this case, the effective inputs to the logic trees would be all zeros for data pattern 10101010, and the effective inputs to the logic trees would be all ones for the data pattern 01010101.

The circuit 200b of FIG. 3A and FIG. 3B illustrates one implementation of this alternative embodiment for a single memory with 8 outputs. This could be extended to include any number of memory blocks with any number of outputs. The inputs "sel<0>" to "sel<7>" act to select the non-inverted memory output for their respective bit when high and the inverted memory output when low.

With reference to FIG. 3A, the AND-tree circuitry for one memory block 170(0) is illustrated along with the output 190a for all memory blocks 170(0)–170(n). The outputs of memory block 170(0) called data<7> to data<0>. Circuit 330(0) is for data<7> and data<6>. One input of OR gate 312 is inverted data<7> and the other input is sel<7>. One input of OR gate 318 is data<7> and inverted sel<7>. Inverters 310 and 320 are used. The outputs of OR gates 312 and 318 are fed to AND gate 314. An analogous circuit is applied for data<6> and sel<6> including AND gate 315. The outputs of AND gate 314 and AND gate 315 are fed to AND gate 316. Circuit 330(0) is replicated, respectively, for each pair of outputs. FIG. 3A illustrates circuits 330(0)–330(3). The outputs of circuits 330(0) and 330(1) are fed to AND gate 332. The outputs of circuits 330(2) and 330(3) are fed to AND gate 334. The outputs of AND gates 332 and 334 are fed to AND gate 336(0). Circuit 340(0) is replicated for each of the n memory blocks 170(0)–170(n). Therefore, n-input AND gate 346 receives an input from each of the circuits 340(0)–340(n) and generates an output 190a. Data outputs 0–7 are carried over bus 338.

With reference to FIG. 3B, the OR-tree circuitry for one memory block 170(0) is illustrated along with the output 190b for all memory blocks 170(0)–170(n). The outputs of memory block 170(0) are called data<7> to data<0> are passed from bus 338. Circuit 362(0) is for data<7> and data<6>. One input of AND gate 350 is data<7> and the other input is sel<7>. One input of AND gate 356 is inverted data<7> and the other input is inverted sel<7>. Inverters 358 and 360 are used. The outputs of AND gates 350 and 356 are fed to OR gate 352. An analogous circuit is applied for data<6> and sel<6> including OR gate 353. The outputs of OR gate 352 and OR gate 353 are fed to OR gate 354. Circuit 362(0) is replicated, respectively, for each pair of outputs. FIG. 3B illustrates circuits 362(0)–362(3). The outputs of circuits 362(0) and 362(1) are fed to OR gate 364. The outputs of circuits 362(2) and 362(3) are fed to OR gate 366. The outputs of OR gates 364 and 366 are fed to OR gate 370(0). Circuit 380(0) is replicated for each of the n memory blocks 170(0)–170(n). Therefore, n-input OR gate 376 receives an input from each of the circuits 380(0)–380(n) and generates an output 190b.

Alternative Designs. Embodiments have been described with all outputs of all memory blocks combined into 2 total outputs. Embodiments of the present invention can also be implemented where the outputs of all memory blocks 170 are combined bit-wise so that the individual bits in the binary word are maintained. That is, output bit 0 from all memory blocks 170 may be combined into one AND output and one OR output; output bit 1 from all memory blocks 170 may be combined into a second AND output and a second OR output; and so on, for all x output bits of the n memory blocks 170.

Although this approach requires more total outputs than the approach described in FIG. 2A–FIG. 2B, it gives more flexibility in terms of data patterns that could be used. Specifically, the approach described in FIG. 2A–FIG. 2B works for solid data words, while this alternative approach would work for any data word. This is an alternative method to the embodiment shown in FIG. 3A and FIG. 3B.

As an example, for the 39K100 exemplary case, each memory block has 8 outputs. Each of these outputs would be combined with the equivalent output of the other memory blocks in both an AND tree and an OR tree, resulting in 16 total chip outputs (I/O pins) required while allowing parallel testing. This is still much better than the 192 outputs needed with the conventional parallel testing methods. It would also be possible to combine the memory block outputs in other ways in order to minimize the number of chip outputs while still maintaining the desired level of flexibility in data word (e.g., test) patterns.

Embodiments of the present invention are described using the logic functions AND and OR. It would be possible to achieve the same goal using different logic gates. For example, logic trees consisting of NAND and NOR gates could implement the same functionality as described herein. It is appreciated that a tree circuit herein may consist of two or more circuit levels with respect to certain embodiments of the present invention.

Figure 4:
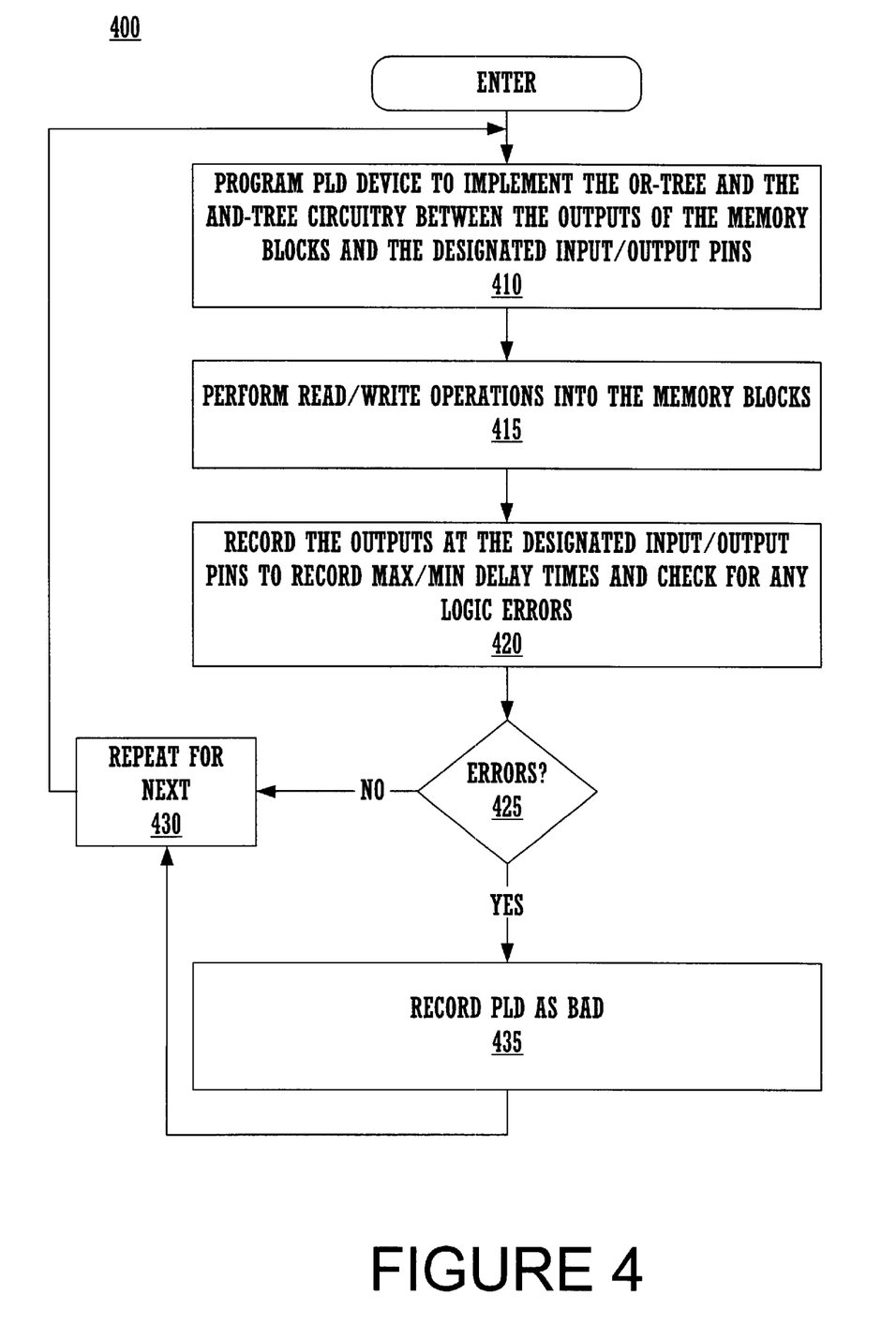
FIG. 4 is a flow diagram of a testing sequence in accordance with one embodiment of the present invention.

FIG. 4 illustrates a flow diagram of steps 400 in accordance with an embodiment of the present invention. At step 410, the tester system 150 may be used to program the configurable resources of the PLD to implement the OR and AND tree circuits which are coupled between the outputs of the memory blocks and the designated I/O pins. At step 415, read/write operations are performed to load predetermined test patterns into the memory blocks and read out the values. These test patterns, when applied to the OR and AND tree circuits will generate known output signals which are captured at step 420. At step 420, the output signals are captured at the I/O pins and check against predetermined values to determine if any manufacturing faults exist.

At step 420, the AND and OR tree circuits can also be used to determine the maximum and minimum signal delay times for the memory blocks. These values are recorded. At step 425, if errors were detected, then the PLD is recorded as bad at step 435. At step 430, process 400 is repeated for another PLD.

Figure 5A:
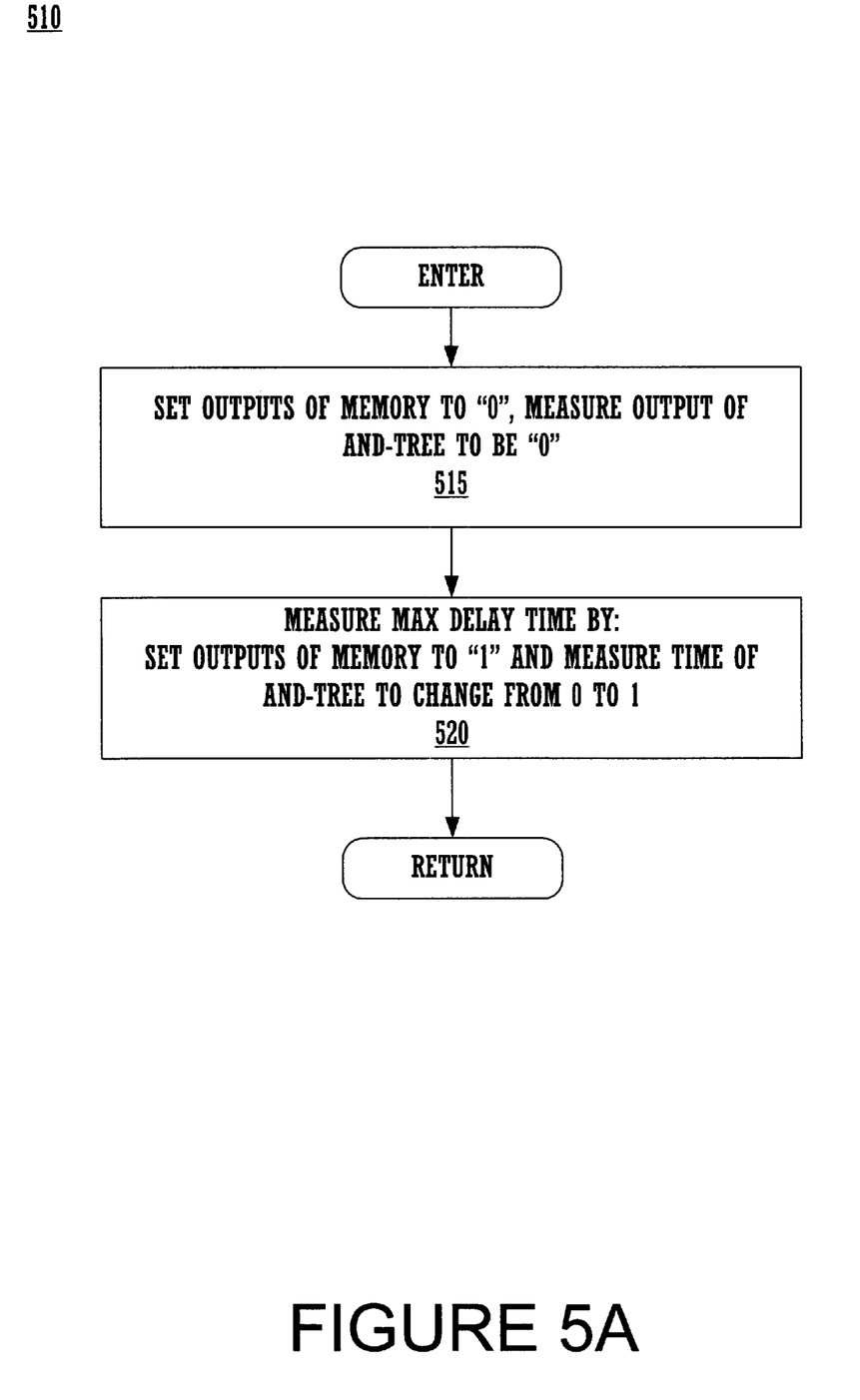
FIG. 5A is a flow diagram of steps to determine a maximum signal delay time using an AND-tree circuit in accordance with one embodiment of the present invention.

FIG. 5A illustrates a process 510 for using the AND-tree to determine a maximum 0 to 1 signal delay through the memory blocks 170(0)–170(n). At step 515, the outputs of the memory blocks are set to all 0, and tester system 150 waits until the output 190a is 0. Then at step 520, a test pattern of all "1s" is loaded into the memory blocks 170 such that the outputs of the memory blocks are all set to 1. The tester system then measures the time between when the test pattern is applied to the memory blocks until the output 190*a* switches from 0 to 1. This is the maximum 0 to 1 signal delay and is recorded.

Figure 5B:
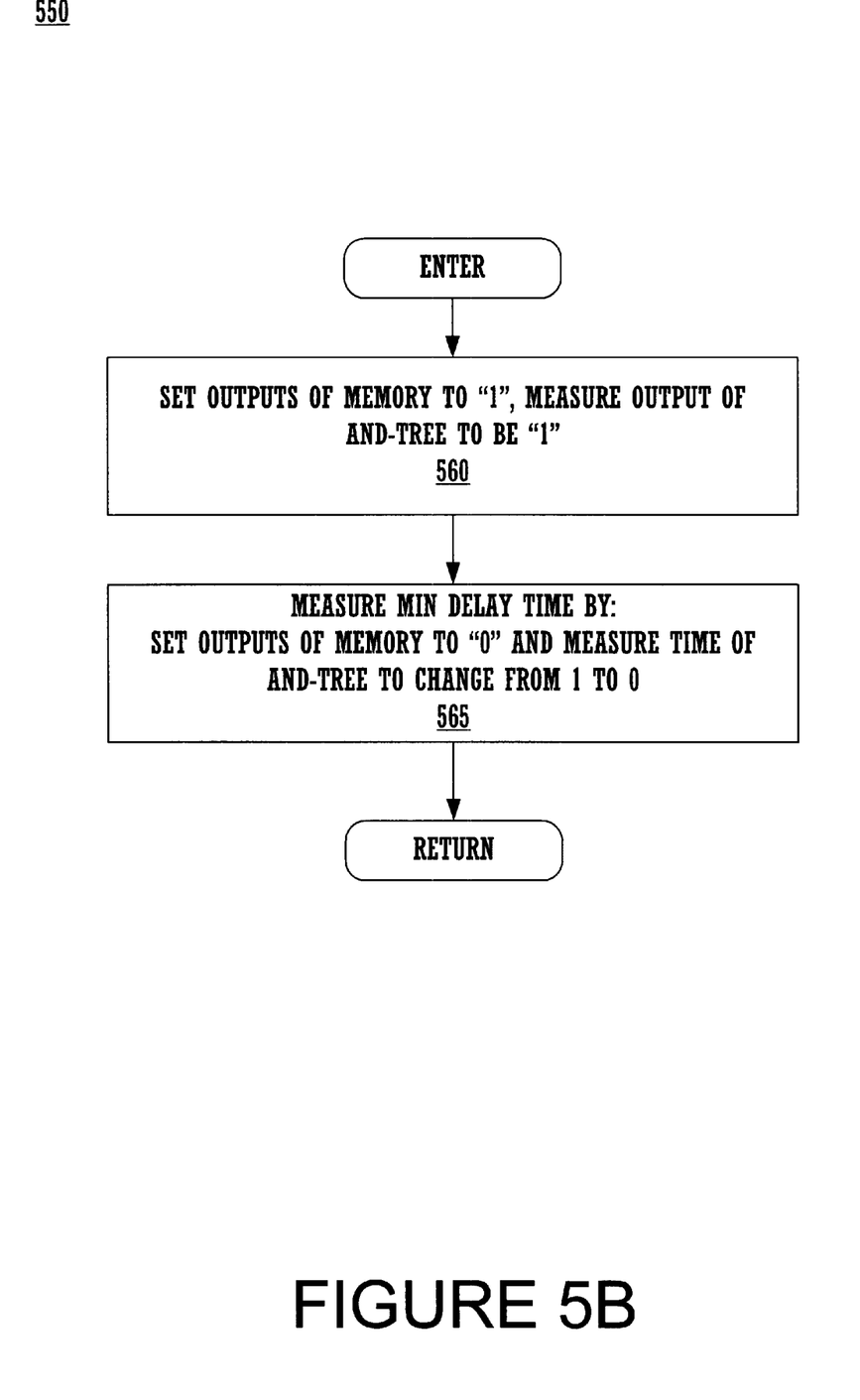
FIG. 5B is a flow diagram of steps to determine a minimum signal delay time using an AND-tree circuit in accordance with one embodiment of the present invention.

FIG. 5B illustrates a process 550 for using the AND-tree to determine a minimum 1 to 0 signal delay through the memory blocks 170(0)–170(n). At step 560, the outputs of the memory blocks are set to all 1, and tester system 150 waits until the output 190*a* is 1. Then at step 565, a test pattern of all "0s" is loaded into the memory blocks 170 such that the outputs of the memory blocks are all set to 0. The tester system then measures the time between when the test pattern is applied to the memory blocks until the output 190*a* switches from 1 to 0. This is the minimum 1 to 0 signal delay and is recorded.

Figure 6A:
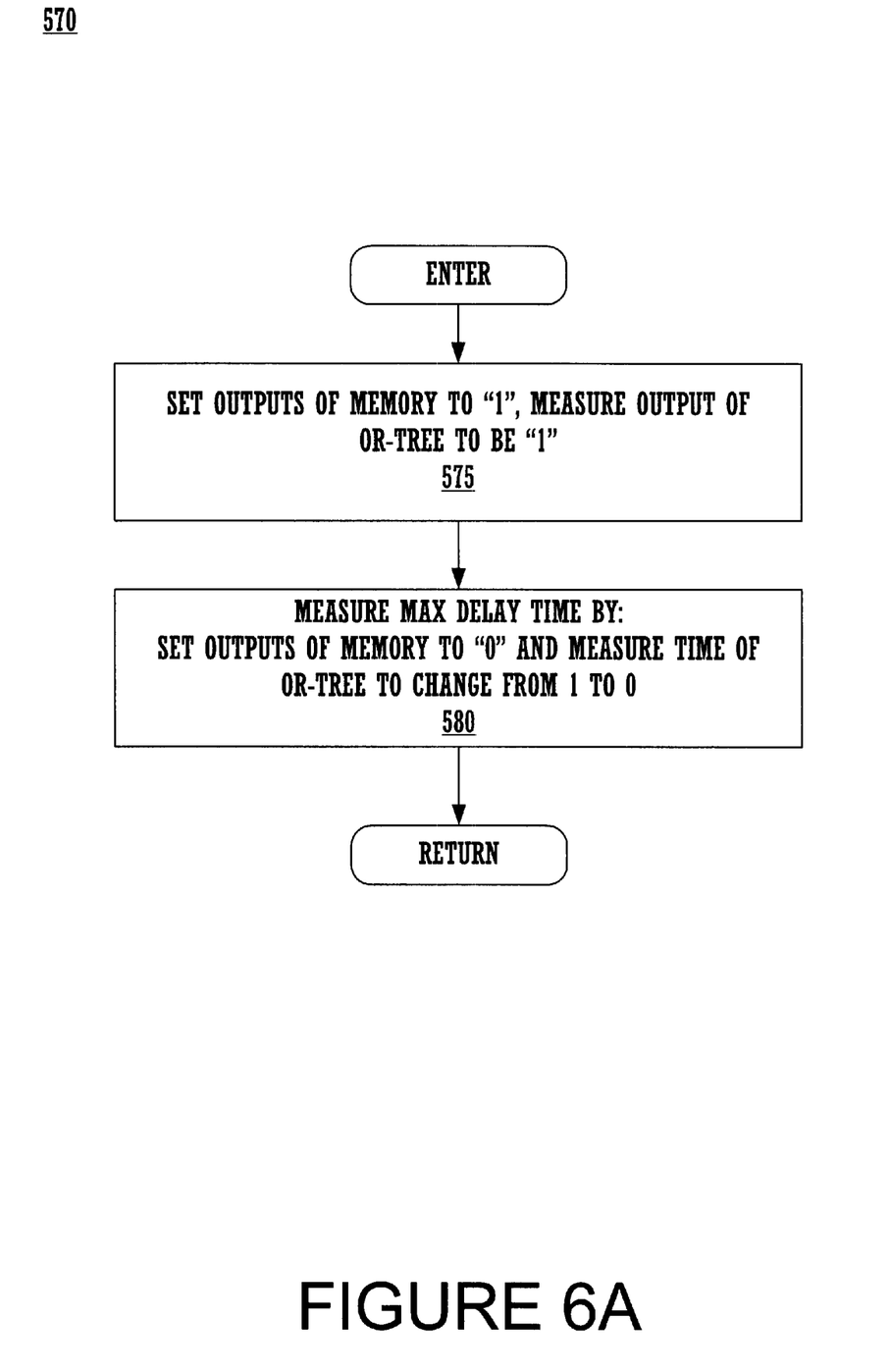
FIG. 6A is a flow diagram of steps to determine a maximum signal delay time using an OR-tree circuit in accordance with one embodiment of the present invention.

FIG. 6A illustrates a process 570 for using the OR-tree to determine a maximum 1 to 0 signal delay through the memory blocks 170(0)–170(n). At step 575, the outputs of the memory blocks are set to all 1, and tester system 150 waits until the output 190*b* is 1. Then at step 580, a test pattern of all "0s" is loaded into the memory blocks 170 such that the outputs of the memory blocks are all set to 0. The tester system then measures the time between when the test pattern is applied to the memory blocks until the output 190*b* switches from 1 to 0. This is the maximum 1 to 0 signal delay and is recorded.

Figure 6B:
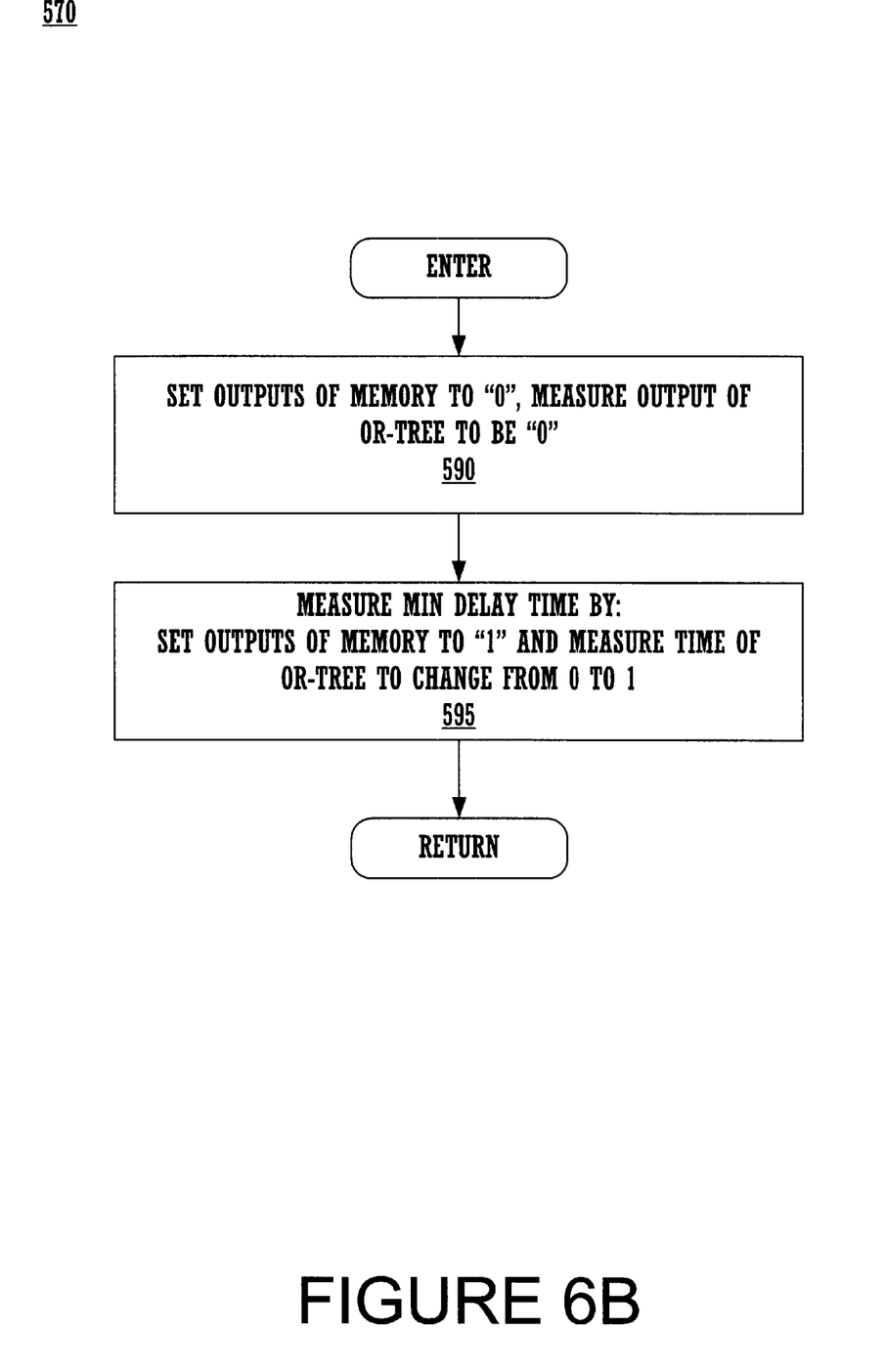
FIG. 6B is a flow diagram of steps to determine a minimum signal delay time using an OR-tree circuit in accordance with one embodiment of the present invention.

FIG. 6B illustrates a process 585 for using the OR-tree to determine a minimum 0 to 1 signal delay through the memory blocks 170(0)–170(n). At step 590, the outputs of the memory blocks are set to all 0, and tester system 150 waits until the output 190*b* is 0. Then at step 595, a test pattern of all "1s" is loaded into the memory blocks 170 such that the outputs of the memory blocks are all set to 1. The tester system then measures the time between when the test pattern is applied to the memory blocks until the output 190*b* switches from 0 to 1. This is the minimum 0 to 1 signal delay and is recorded.

Figure 7:
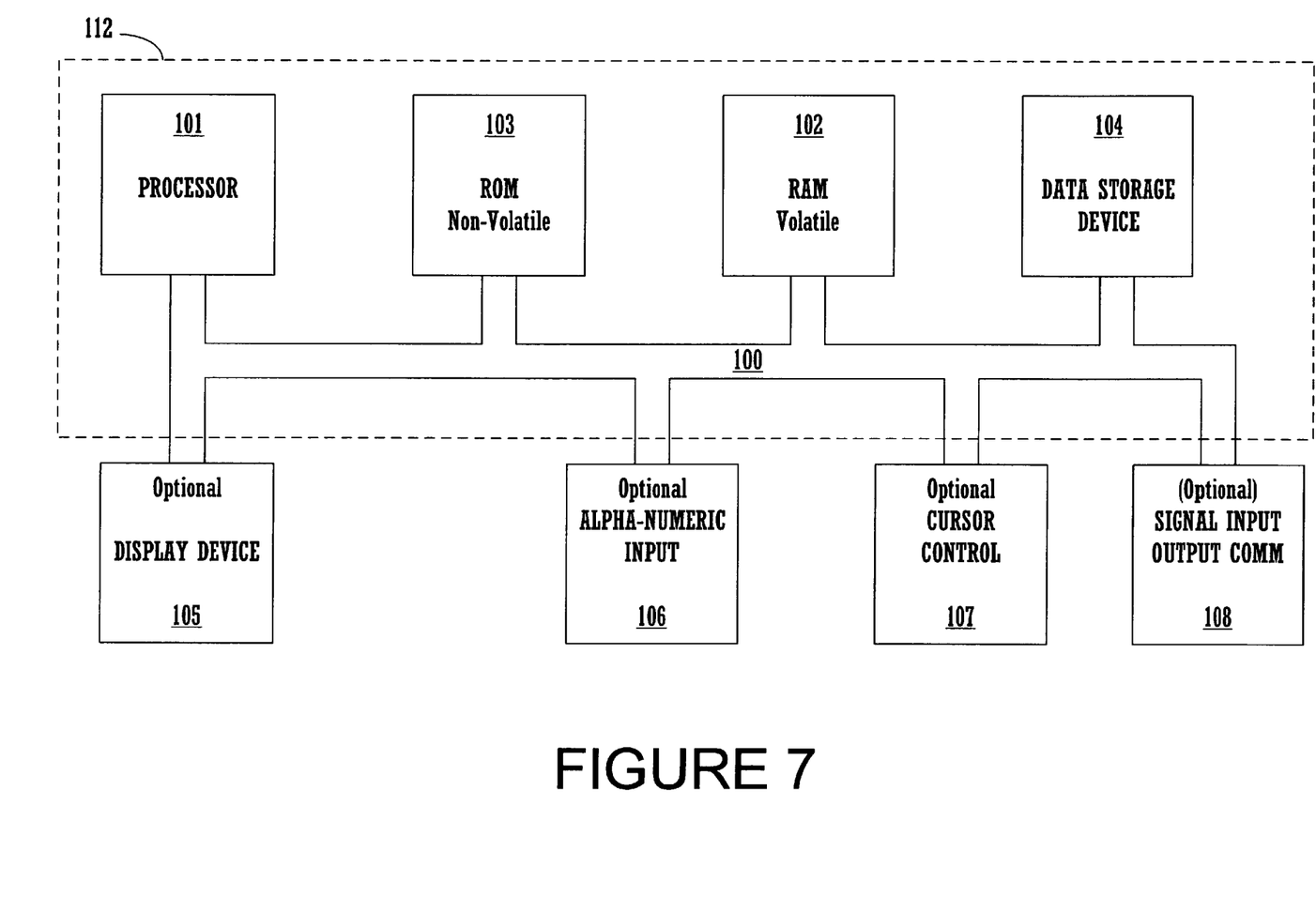
FIG. 7 is a general purpose computer system which can be employed within the tester system to execute software testing processes and sequences.

FIG. 7 illustrates a computer system 112 which can act as a computer platform, e.g., controller, for the tester system 150 (FIG. 1) of the present invention. In one embodiment, system 112 is a general purpose computer system and includes an address/data bus 100 for communicating information, one or more central processor(s) 101 coupled with bus 100 for processing information and instructions, a computer readable volatile memory unit 102 (e.g., random access memory, static RAM, dynamic RAM, etc.) coupled with bus 100 for storing information and instructions for the central processor(s) 101, a computer readable non-volatile memory unit 103 (e.g., read only memory, programmable ROM, flash memory, EPROM, EEPROM, etc.) coupled with bus 100 for storing static information and instructions for processor(s) 101. System 112 can optionally include a mass storage computer readable data storage device 104, such as a magnetic or optical disk and disk drive coupled with bus 100 for storing information and instructions.

Optionally, system 112 can also include a display device 105 coupled to bus 100 for displaying information to the computer user, an alphanumeric input device 106 including alphanumeric and function keys coupled to bus 100 for communicating information and command selections to central processor(s) 101, a cursor control device 107 coupled to bus for communicating user input information and command selections to the central processor(s) 101, and a signal input/output device 108 coupled to the bus 100 for communicating messages, command selections, data, etc., to and from processor(s) 101.

The preferred embodiment of the present invention, a time efficient and I/O pin efficient method of testing a programmable device that also obtains maximum and minimum signal delays, is thus described. While the present invention has been described in particular embodiments, it should be appreciated that the present invention should not be construed as limited by such embodiments, but rather construed according to the below claims.

What is claimed is:

1. A method of testing an integrated circuit device comprising the steps of:
   a) testing a plurality of electronic circuits in parallel by applying a test vector to said plurality of electronic circuits, said plurality of electronic circuits having a set of outputs;
   b) applying said set of outputs to a logic circuit coupled to said electronic circuits, said logic circuit comprising multiple stages of logic gates, wherein outputs from a first stage are used as inputs to a second stage and wherein said second stage comprises fewer logic gates than said first stage, wherein said set of outputs cause said logic circuit to generate a first resulting output signal; and
   c) detecting a defect within said plurality of electronic circuits by comparing said first resulting output signal to a pre-determined first expected output signal.

2. A method as described in claim 1 wherein said plurality of electronic circuits comprise a plurality of embedded memory blocks and wherein said integrated circuit device is a programmable logic device.

3. A method as described in claim 2 wherein said logic circuit is implemented using configurable logic resources of said programmable logic device.

4. A method as described in claim 1 wherein said logic circuit is an AND-tree circuit.

5. A method as described in claim 1 wherein said logic circuit is an OR-tree circuit.

6. A method as described in claim 1 and further comprising the step of d) determining a maximum signal delay time of said plurality of electronic circuits by measuring a time between a transition of said first resulting output signal and said step of applying said test vector.

7. A method as described in claim 1 and further comprising the step of d) determining a minimum signal delay time of said plurality of electronic circuits by measuring a time between a transition of said first resulting output signal and said step of applying said test vector.

8. A method of testing a programmable logic device comprising the steps of:
   a) testing a plurality of electronic circuits in parallel by applying a test vector to said plurality of electronic circuits, said plurality of electronic circuits having a set of outputs;
   b) applying said set of outputs to an AND-tree circuit coupled to said electronic circuits, wherein said AND-tree comprises a plurality of AND gates arranged to generate a single output from said set of outputs, wherein said set of outputs cause said AND-tree to generate a first resulting output signal;
   c) applying said set of outputs to an OR-tree circuit coupled to said electronic circuits, wherein said OR-tree comprises a plurality of OR gates arranged to generate another single output from said set of outputs, wherein said set of outputs cause said OR-tree to generate a second resulting output signal; and
   d) detecting a defect within said plurality of electronic circuits by comparing said first and second resulting output signals to pre-determined first and second expected output signals.

9. A method as described in claim 8 wherein said plurality of electronic circuits comprises a plurality of embedded memory blocks within said programmable logic device.

10. A method as described in claim 9 wherein said AND-tree is implemented using configurable logic resources of said programmable logic device.

11. A method as described in claim 9 wherein said OR-tree is implemented using configurable logic resources of said programmable logic device.

12. A method as described in claim 9 and further comprising the step of determining a maximum signal delay time of said plurality of electronic circuits by measuring a time between a transition of said first resulting output signal and said step of applying said test vector.

13. A method as described in claim 12 and further comprising the step of determining a minimum signal delay time of said plurality of electronic circuits by measuring a time between a transition of said first resulting output signal and said step of applying said test vector.

14. A method as described in claim 9 and further comprising the step of determining a maximum signal delay time of said plurality of electronic circuits by measuring a time between a transition of said second resulting output signal and said step of applying said test vector.

15. A method as described in claim 14 and further comprising the step of determining a minimum signal delay time of said plurality of electronic circuits by measuring a time between a transition of said second resulting output signal and said step of applying said test vector.

16. A method as described in claim 8 further comprising the steps of applying said plurality of outputs of said electronic circuit to said AND-tree circuit and said OR-tree circuit using a polarity selection circuit wherein said polarity selection circuit can selectively apply each electronic circuit output and its inverse to said AND-tree and said OR-tree in a bit-wise fashion.

17. A programmable logic device comprising:
  a plurality of electronic circuits comprising a set of outputs and capable of receiving an input test vector for parallel testing operations;
  a logic circuit coupled to said set of outputs, said logic circuit comprising a first tree circuit and a second tree circuit, said first and second tree circuits each configured with multiple stages of logic gates, wherein outputs from a first stage are used as inputs to a second stage and wherein said second stage comprises fewer logic gates than said first stage, said first tree circuit for generating a first resulting output signal in response to said set of outputs and said second tree circuit for generating a second resulting output signal in response to said set of outputs; and
  wherein said first and second resulting output signals are for use by a tester system in detecting a defect within said plurality of electronic circuits by comparing said first and second resulting output signals to pre-determined first and second expected output signals.

18. A programmable logic device as described in claim 17 wherein said first tree circuit comprises an AND-tree circuit and wherein said second tree circuit comprises an OR-tree circuit.

19. A programmable logic device as described in claim 18 wherein said AND-tree circuit is implemented using configurable logic resources of said programmable logic device.

20. A programmable logic device as described in claim 18 wherein said OR-tree circuit is implemented using configurable logic resources of said programmable logic device.

21. A programmable logic device as described in claim 18 wherein said first and second resulting output signals are for use by said tester system in determining a maximum signal delay time of said plurality of electronic circuits.

22. A programmable logic device as described in claim 18 wherein said first and second resulting output signals are for use by said tester system in determining a minimum signal delay time of said plurality of electronic circuits.

23. A programmable logic device as described in claim 17 wherein said plurality of electronic circuits comprise a plurality of embedded memory blocks within said programmable logic device.

* * * * *